(12) United States Patent
Huang

(10) Patent No.: US 8,389,317 B2
(45) Date of Patent: Mar. 5, 2013

(54) MEMS DEVICE AND METHOD OF FABRICATING THE SAME

(75) Inventor: Herb He Huang, Shanghai (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 268 days.

(21) Appl. No.: 12/788,622

(22) Filed: May 27, 2010

(65) Prior Publication Data

US 2010/0301430 A1 Dec. 2, 2010

Related U.S. Application Data

(60) Provisional application No. 61/181,828, filed on May 28, 2009.

(51) Int. Cl.
*H01L 21/00* (2006.01)

(52) U.S. Cl. .................. 438/52; 257/415; 257/E29.324

(58) Field of Classification Search .................. 439/816; 438/50, 53, 52; 257/E21.159, E29.324, 415
See application file for complete search history.

(56) References Cited

U.S. PATENT DOCUMENTS

| | | | | |
|---|---|---|---|---|
| 6,139,964 | A * | 10/2000 | Sathrum et al. | 428/408 |
| 6,184,053 | B1 * | 2/2001 | Eldridge et al. | 438/52 |
| 6,657,525 | B1 * | 12/2003 | Dickens et al. | 335/78 |
| 6,933,165 | B2 * | 8/2005 | Musolf et al. | 438/50 |
| 7,356,920 | B2 * | 4/2008 | Hantschel et al. | 29/841 |
| 7,989,905 | B2 * | 8/2011 | Watanabe et al. | 257/415 |
| 8,033,838 | B2 * | 10/2011 | Eldridge et al. | 439/81 |
| 2006/0181379 | A1 * | 8/2006 | Schwartz et al. | 335/78 |
| 2007/0032095 | A1 * | 2/2007 | Ramaswamy et al. | 438/795 |
| 2007/0095497 | A1 * | 5/2007 | Chen | 164/138 |
| 2007/0215965 | A1 * | 9/2007 | Yang et al. | 257/415 |
| 2009/0011225 | A1 * | 1/2009 | Moronuki et al. | 428/334 |
| 2009/0108381 | A1 * | 4/2009 | Buchwalter et al. | 257/415 |
| 2009/0215213 | A1 * | 8/2009 | Chou | 438/48 |
| 2009/0275203 | A1 * | 11/2009 | Tang | 438/703 |
| 2010/0015744 | A1 * | 1/2010 | Kazinzci | 438/52 |
| 2010/0093229 | A1 * | 4/2010 | Eldridge et al. | 439/816 |
| 2010/0314669 | A1 * | 12/2010 | Huang | 257/254 |
| 2011/0256691 | A1 * | 10/2011 | Ramaswamy et al. | 438/477 |

* cited by examiner

*Primary Examiner* — Matthew Landau
*Assistant Examiner* — Joseph C Nicely
(74) *Attorney, Agent, or Firm* — J.C. Patents

(57) ABSTRACT

A micro electrical-mechanical system (MEMS) device comprises a suspended thin film microstructure which includes an anchoring portion adhered to the top surface of the substrate and a suspended portion above the top surface of the substrate. Having a base plane configured in parallel to the substrate, the suspended portion further includes a first recess portion spaced at a first vertical clearance with the substrate, the first vertical clearance being configured differentially smaller than a base clearance of the suspended portion outside the first recess portion. The method for processing a MEMS device includes: depositing a first carbon film, etch-removing a first sacrificial pre-removal portion and an anchor portion of the first carbon film, depositing a second carbon film conformally topping the first carbon film and the substrate, etch-removing the anchor portion of the second carbon film, depositing and patterning the suspended thin film microstructure onto the first carbon film, the second carbon film and the substrate, removing the first carbon film and the second carbon film to release the suspended thin film microstructure above the substrate by selective gaseous oxidation or nitridation preferably enhanced via plasma.

5 Claims, 3 Drawing Sheets

MEMS DEVICE AND METHOD OF FABRICATING THE SAME

CROSS-REFERENCE TO RELATED APPLICATIONS

This application claims priority of provisional application No. 61/181,828, filed on May 28, 2009, entitled "THIN FILM MEMS DEVICE ON A SUBSTRATE AND METHOD OF PROCESSING THE SAME", which is incorporated herein by reference in its entirety.

FIELD OF THE TECHNOLOGY

The present invention relates to a micro-electro-mechanical system (MEMS) device and a method of fabricating the same.

BACKGROUND

MEMS includes integrated micro devices, such as mechanical, optical and thermal sensing components, formed on a substrate made of a single or composite layers of solid state materials. The MEMS is fabricated by using the state-of-art wafer batch processing techniques to form those micro devices, sized from nanometers to millimeters, on a solid state substrate, such as on a silicon wafer. Those MEMS devices are operating for sensing, controlling, and actuating various mechanical, optical or chemical functions on a micro scale, individually in single units or collaboratively in arrays for generating coordinated overall effects on a macro scale. Applications of such MEMS devices include, but not limited to, accelerometers, gyroscopes, pressure sensors, chemical and flow sensors, micro-optics devices, optical scanners, fluid flow control devices, chemical sensing and chemical delivery systems, and biological sensors among many others.

Furthermore, MEMS devices may be fabricated together in a unified process with supporting integrated circuit (IC) devices on the same semiconductor substrate as an integrated silicon device, namely as an integrated MEMS. Advantageously, such integrated MEMS in a single chip solution not only greatly reduce the size, weight and power consumption but also enhance the performance of an application system when compared with the conventional construction which separates MEMS and supporting IC as different micro devices.

Fabrication of MEMS devices employs many of the same processing steps as the fabrication of IC. In particular, the formation of an MEMS device involves depositing and patterning solid state thin films on a substrate surface, such as a silicon wafer surface, to produce complex micro devices. Such solid state thin film materials may be used include but not limited to silicon dioxide, silicon nitride, polycrystalline silicon (poly), amorphous silicon, aluminum, copper, refractory metals and their oxide or nitride compounds.

However, to achieve certain mechanical, optical or thermal functions of MEMS devices, it is necessary to spatially decouple selected micro structural elements in MEMS devices to form a gap or cavity between the decoupled and the rest. Such decoupling of micro structural elements in MEMS devices enables certain desired mechanical, thermal, chemical or optical functions as required. For example, a number of MEMS motion sensors contain two or more micro structural elements which are spatially separated but could move relatively to each other. In many MEMS devices, cavities and suspended structural elements are necessities to be fabricated only through a wafer-level micromachining process. An approach to form a gap or cavity between a top and bottom structural elements in an MEMS device involves selective etching a solid sacrificial layer or element. This sacrificial layer is first formed on the bottom structural element and then as the underline physical supporting base, enables deposition and patterning of the top structural element.

After depositing the sacrificial layer and forming the top structural element, the sacrificial layer is eventually removed selectively from the top structural element, completely or at least partially. In general, such sacrificial layer removal processes fall into two categories, wet etching and dry etching. In a wet etching sacrificial layer removal process, the microstructure is immersed with the carrier wafer in or exposed to a liquid chemical bath containing an adequate etchant solution for dissolving and removing the sacrificial layer. This approach is very effective for forming a cavity or undercut on a large scale, ranging from tens or hundreds of micrometers. On a smaller scale, a number of drawbacks are encountered limiting a wet etching sacrificial layer removal process from extended application to micromachining of MEMS structural elements at an increased high precision and device density, preferably compatible to mainstream IC fabrication processes.

Overcoming many of those disadvantages and limitations, a dry etching process uses a gas as the primary etchant solution without accompanying wet chemicals or bath, less aggressive than wet etching processes, allowing the formation of smaller and more delicate structures on a substrate surface with the decreased risk of structure damage.

A number of sacrificial layer formation and according dry etching removal schemes with good etch selectivity over other materials are developed and applied to MEMS devices fabrication. A reported scheme is using a developed photoresist as the sacrificial layer, depositing and patterning the top structural element and later, dry etching removing the underline partially exposed photoresist layer via oxygen plasma ashing. The disadvantages of using photoresist as a sacrificial layer including poor mechanical support to its top structural element, low temperature tolerance to proceeding thin film processing, and out-gassing of residual chemical species after development among all. Other inorganic materials disclosed and used as a sacrificial layer in the prior art would resolve those issues with photoresist but most of them are exotic materials or its dry etching removing process is not compatible to IC processing given the selectivity requirement to meet.

SUMMARY

The present invention relates to an MEMS device and a method of fabricating the same, in order to form a suspended thin film microstructure on a solid state substrate by using multiple stacked carbon films as sacrificial layers.

An embodiment of the present invention discloses an MEMS device incorporating a suspended thin film microstructure above a substrate, wherein the suspended thin film microstructure includes at least one anchoring portion adhered onto the substrate and a suspended portion spaced above the substrate. Therein the suspended portion, having a base plane configured in parallel to the substrate vertically at a base clearance, has a first recess portion spaced at a first vertical clearance differentially smaller than the base clearance, measured from the bottom surface of the suspended thin film microstructure to the top surface of the substrate.

Additional embodiment of the present invention provides a method of fabricating the MEMS device, including: depositing a first carbon film, etch-removing a first sacrificial pre-removal portion of the first carbon film, depositing a second carbon film conformally topping the first carbon film and the substrate, etch-removing the anchor portion of the second carbon film, depositing and patterning the suspended thin film microstructure onto the first carbon film, the second carbon film and the substrate, removing the first carbon film and the second carbon film to release the suspended thin film microstructure above the substrate by selective gaseous oxidation or nitridation preferably enhanced via plasma.

The suspended thin film microstructure topping the first carbon film and the second carbon film as well as the substrate is then formed by thin film deposition, photo lithographically patterning in association with wet photoresist stripping, and selectively etching processes used in semiconductor fabrication. Eventually the first carbon film and the second carbon film, partially covered by the suspended thin film microstructure, are selectively removed by oxygen-plasma or nitrogen-plasma ashing, via an opening outside overlap between the first carbon film and the second carbon film, and the suspended thin film microstructure so that a cavity is formed underneath and the suspended thin film microstructure is released above the substrate.

Such a suspended thin film microstructure, processed through those sequential steps of thin film deposition and patterning process, therein has a base plane parallel to the substrate at a base clearance with the top surface of the substrate. Fabricated through the disclosed method, the suspended thin film microstructure also possesses a first recess portion, corresponding to the first sacrificial pre-removal portion of the first carbon film, with a first vertical clearance from the substrate substantially close to thickness of the second carbon film but differentially smaller than the base clearance.

Other additional embodiments further discloses a suspended thin film microstructure on a substrate further includes a second recess portion spaced at a second vertical clearance above the substrate and the method of making the same, by depositing and patterning a third carbon film onto the second carbon film before depositing and patterning the suspended thin film microstructure.

Even processed with a plurality of thin film layers in a stacking sequence of processing steps on top of the suspended thin film microstructure and the first carbon film and the second carbon film, an MEMS device with such a suspended thin film microstructure is readily produced, as long as an opening is formed and maintained so that plasma activated oxygen or nitrogen etchant is allowed to enter the opening and to selectively remove the remaining portion of the first carbon film and the second carbon film as sacrificial layers.

BRIEF DESCRIPTION OF THE DRAWINGS

The drawings are not necessarily to scale, emphasis instead being placed upon illustrating the framework and principles of the disclosed invention.

DETAILED DESCRIPTION

The present invention is described in detail below through embodiments accompanied with drawings.

Figure 1:
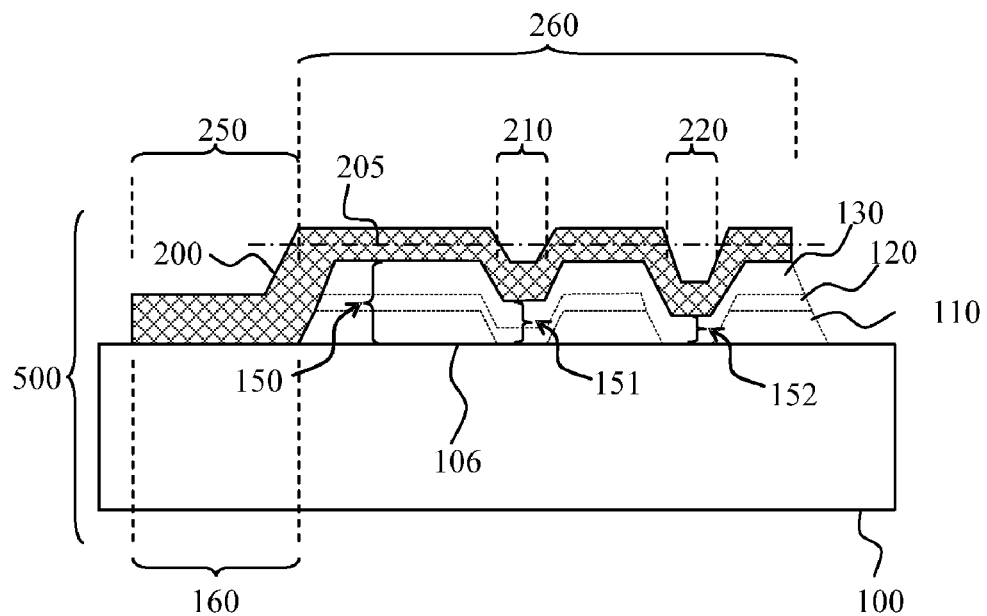
FIG. 1 is a cross-sectional view of the MEMS device in an embodiment of the present invention.

FIG. 1 is a cross-sectional view of the MEMS device in an embodiment of the present invention including a suspended thin film microstructure 200 on a substrate 100 fabricated by using multiple carbon films, 110, 120 and 130, as sacrificial layers underneath. The MEMS device drawn hereby exemplifies some of the micro structural elements on many types of existing MEMS devices, including the suspended thin film microstructure 200 physically suspended above but is electrically connected with and interacts with the substrate 100 which may further contain integrated circuits.

Specifically, the MEMS device consists of the suspended thin film microstructure 200 which is produced through sequential steps of thin film deposition and patterning process used in semiconductor fabrication on the substrate 100 (e.g., a semiconductor substrate). As thus processed, the main body of the suspended thin film microstructure 200 is configured with a base plane 205 and geometrically in parallel to the substrate 100. Serving the physical connection to the substrate 100, the suspended thin film microstructure 200 includes at least an anchoring portion 250 which is physically adhered to the anchoring portion 160 on the top surface 106 of the substrate 100, and a suspended portion 260 above the top surface 106 of the substrate 100 having clearance with the substrate 100 and thus a cavity underneath, as shown in FIG. 1.

Although the main body of the suspended thin film microstructure 200 are formed in a film or thin plate configuration with the base plane 205 in parallel to the substrate 100, the suspended thin film microstructure 200 of the present embodiment may contain different portions having different vertical clearances with the underneath substrate 100. In one alternative embodiment, the suspended thin film microstructure 200 contains a first recess portion 210 and a second recess portion 220 with a first vertical clearance 151 and a second vertical clearance 152, respectively, with the top surface 106 of the substrate 100. Herein on the suspended thin film microstructure 200, the second vertical clearance 152 of the second recess portion 220 is configured differentially smaller than the first vertical clearance 151 of the first recess portion 210, while the first vertical clearance 151 differentially smaller than the base clearance 150 of the base plane 205 of the suspended portion 260 with the top surface 106 of the substrate 100.

Such an uneven topography, particularly on the bottom surface of the suspended thin film microstructure 200 shown in FIG. 1, above the relatively flat substrate 100 is readily fabricated through the method further disclosed below, consisting of a sequence of processing steps of thin film deposition and patterning with help of multiple sacrificial layers of carbon films, a first carbon film 110, a second carbon film 120 and third carbon film 130. Two differential surface recesses and vertical clearances, the first vertical clearance 151 and the second vertical clearance 152, from the base clearance 150 are thus formed above the top surface 106 of the substrate 100, and thus the uneven film topography.

FIGS. 2a, 2b, 2c and 2d are a sequence of cross-sectional views, illustrating an embodiment of the method in sequential processing steps for forming the suspended thin film microstructure 200 disclosed in this invention. To fabricate the suspended thin film microstructure 200 having three differential clearances, the first vertical clearance 151 and the second vertical clearance 152 besides the base clearance 150, with a substrate 100, three carbon films, i.e., a first carbon film 110, a second carbon film 120 and third carbon film 130, are deposited and patterned sequentially, as stacked sacrificial layers, before depositing and patterning the suspended thin film microstructure 200 (as shown in FIG. 1).

In the present embodiment, the carbon films, i.e., the first carbon film 110, the second carbon film 120 and the third carbon film 130, in either an amorphous or crystalline structure may be deposited sequentially via a plasma-enhanced chemical vapor deposition (PECVD) process. When the carbon films are made from amorphous carbon, they can be deposited under a reaction temperature of 350-450. Specifically, the first carbon film 110, the second carbon film 120 or the third carbon film 130 may be deposited by means of: placing the substrate 100 in a reactor chamber; introducing a carbon-containing process gas into the reactor chamber and introducing a layer-enhancing additive gas that enhances thermal properties of the carbon film; generating a reentrant toroidal RF plasma current in a reentrant path that includes a process zone overlying the substrate 100 by coupling a plasma RF source power to an external portion of the reentrant path; and coupling RF plasma bias power or bias voltage to the substrate 100. The first carbon film 110, the second carbon film 120 or the third carbon film 130 may includes less than 9 percent of hydrogen.

Figure 2A:
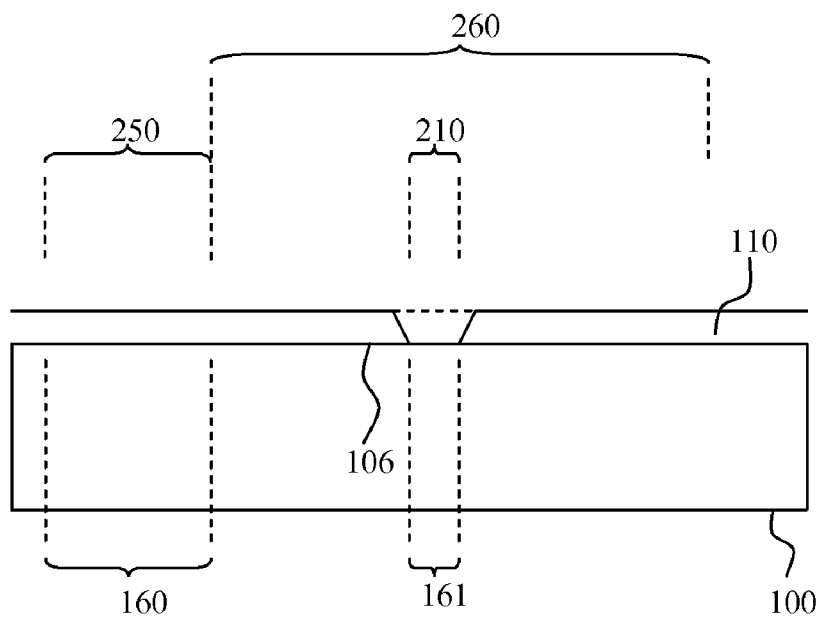
FIGS. 2a, 2b, 2c and 2d are a sequence of cross-sectional views illustrating sequential processing steps in a method of fabricating the MEMS device in and embodiment of the present invention.

As shown in FIG. 2a, a first carbon film 110 is deposited on a substrate 100. Specifically, the first carbon film 110 is deposited uniformly topping the substrate 100, preferably a semiconductor substrate 100 like a silicon wafer. Then, lithographically patterning is applied to the first carbon film 110 to remove a first sacrificial pre-removal portion 161 corresponding to a first recess portion 210 of a suspended thin film microstructure 200. The first sacrificial pre-removal portion 161 is an etch-removing portion which is not protected by developed photoresist.

Figure 2B:
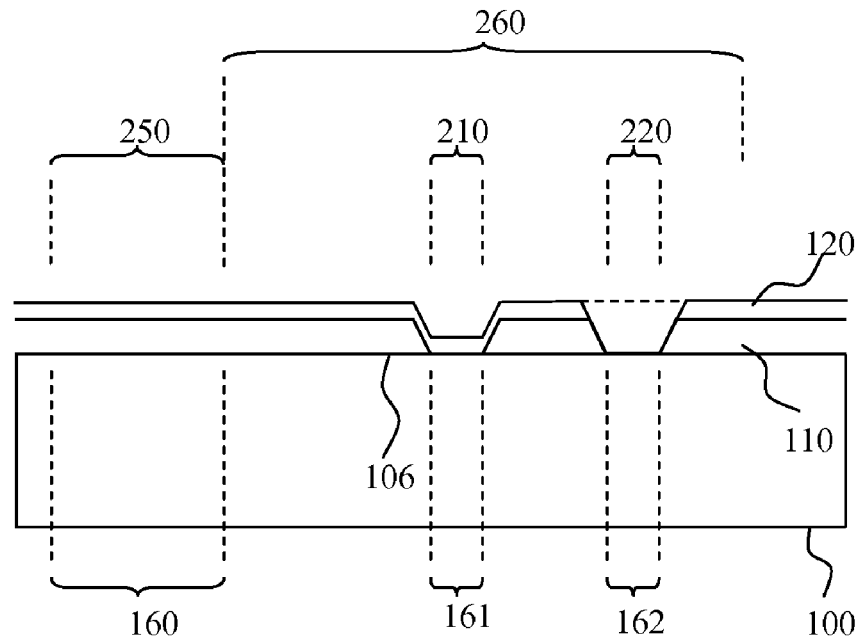

Further, as shown in FIG. 2b, a second carbon film 120 is then conformally deposited on the first carbon film 110 after applying lithographically patterning; and then followed by another lithographically patterning applied to the second carbon film 120 to remove a second sacrificial pre-removal portion 162 corresponding to a second recess portion 220 of the suspended thin film microstructure 200. The second sacrificial pre-removal portion 162 is also an etch-removing portion which is not protected by developed photoresist. Herein the previously exposed first sacrificial pre-removal portion 161 is still covered with the second carbon film 120 upon removing and exposing the second sacrificial pre-removal portion 162.

Figure 2C:
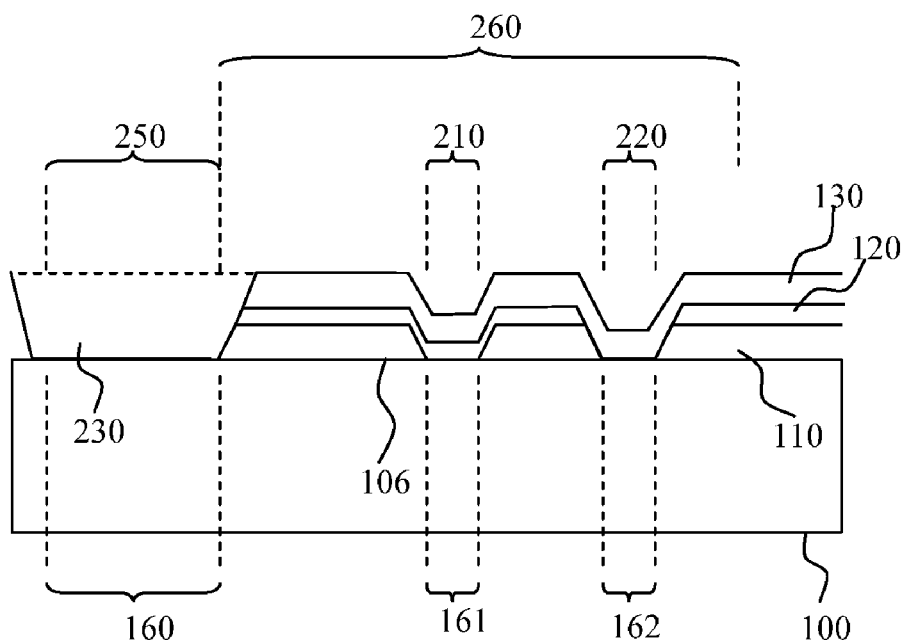

Later, as shown in FIG. 2c, a third carbon film 130 is deposited conformally onto the second carbon film 120 after applying lithographically patterning, so as to conformally covering the whole area on the substrate 100 including the first sacrificial pre-removal portion 161 and the second sacrificial pre-removal portion 162 in differential vertical recessions as illustrated in FIG. 2c. Lithographically patterning is further applied to the third carbon film 130 to form an opening 230 so as to expose the anchoring portion 160 of the substrate 100 while having the remaining carbon film intact from the forming of the opening 230 in the first sacrificial pre-removal portion 161 and the second sacrificial pre-removal portion 162.

Figure 2D:
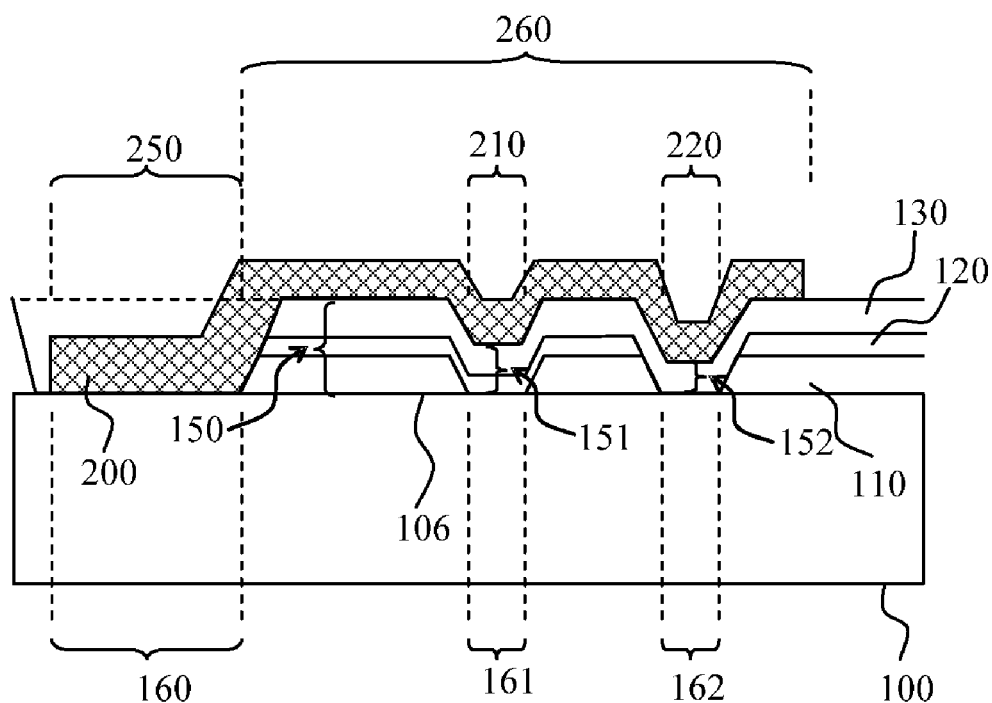

As shown in FIG. 2d, the suspended thin film microstructure 200 is deposited onto the stack of the first carbon film 110, the second carbon film 120 and third carbon film 130 and then the suspended thin film microstructure 200 is lithographically patterned so as to be eventually shaped to its desired planar geometry, while creating opening to the underlining carbon films, 110, 120 and 130 in stack for the sake of ashing process. Finally the first carbon film 110, the second carbon film 120 and third carbon film 130 are removed, and specifically, any of the carbon film may be selectively removed by using oxygen-plasma or nitrogen plasma ashing process. For example, any of the first carbon film 110, the second carbon film 120 and the third carbon film 130 may be removed by selective etch process gas of oxygen or nitrogen in a reactor chamber containing plasma generated with a plasma source power.

Thus, by performing the above steps, a cavity is formed underneath the suspended portion 260 of the suspended thin film microstructure 200 which is physically separated from the substrate 100 while the anchoring portion 250 keeps the suspended thin film microstructure 200 anchored and connected with the substrate 100. Therefore underneath the suspended portion 260, the first recess portion 210 and the second recess portion 220 of the suspended thin film microstructure 200 have the differential clearances, i.e., a first vertical clearance 151 and a second vertical clearance 152, with the base clearance 150. As formed by three sequential sacrificial layers of carbon films, the first vertical clearance 151 is thus configured differentially smaller than the base clearance 150, and the second vertical clearance 152 differentially smaller than the first vertical clearance 151, as jointly shown in FIG. 1 and FIG. 2d.

Any of the carbon films, 110, 120 and 130 may be removed by using an oxygen plasma ashing or nitrogen plasma ashing process to allow plasma activated oxygen or nitrogen etchant to enter an opening outside the stack of the carbon films, and the photoresist used for patterning may be selectively removed via wet stripping and other similar methods.

In another embodiment, the described above configuration of the suspended thin film microstructure 200 in the MEMS device 500 may be simplified to have just two vertical clearances on its suspended portion 260, the first vertical clearance 151 and the base clearance 150, that is, the suspended portion 260 may only include the first recess portion 210 but not include the second recess portion 220. Accordingly, the method for fabricating such simplified the MEMS device is also simplified, that is, the steps corresponding to the second carbon film 120 may be reduced. Specifically, the step may includes: depositing a first carbon film 110 onto a substrate 100; lithographically patterning the first carbon film 110 to remove a first sacrificial pre-removal portion 161 corresponding to a first recess portion 210 of a suspended thin film microstructure; depositing a third carbon film 130 conformally onto the first carbon film 110 after applying lithographically patterning; lithographically patterning the third carbon film 130 to form an opening so as to expose an anchoring portion 160 of the substrate 100; depositing and lithographically patterning the suspended thin film microstructure 200 onto a stack of the first carbon film 110 and the third carbon film 130; and removing the first carbon film 110 and the third carbon film 130.

In addition, the suspended thin film microstructure 200 in the MEMS device 500 may also have more than three vertical clearances on its suspended portion 260 which can be fabricated based on the above method with only difference that an additional carbon film as a sacrificial layer would be further needed for an additional vertical clearance.

For various functional needs, a suspended thin film microstructure 200 might be composed of a single or multiple layers of different solid state materials through a sequence of film deposition processes used in semiconductor fabrication, for example, physical vapor deposition (PVD) or chemical vapor deposition (CVD), on top of remaining portion of the carbon films 110, 120 and 130, as shown in FIG. 2d. The deposited layers of the suspended thin film microstructure 200 are then lithographically patterned using photoresist (or in combination with other materials) as the etch mask, by one or multiple steps of etch processing with high etch selectivity over the remaining portion of the carbon films 110, 120 and 130. A number of such solid state materials are available to be used for forming such a suspended thin film microstructure 200 and performing desired mechanical, optical and/or chemical functions, including but not limited to: polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, gold and platinum. Certain carbides are also potential candidates containing less than 60 percent of carbon, such as silicon carbide, tungsten carbide, aluminum carbide, and carbon nitride.

Noticeably, the aforementioned methods for forming an MEMS device do not require a specific type of the substrate 100 or material as long as it is compatible to the fabrication process defined above. In rather a broader definition, the substrate 100 could be a solid state wafer including layers selected from among solid state semiconductor, dielectric materials and conductor materials. Besides, the carbon films mentioned above are not only limited to use for sacrificial etch and topographical modification, but also could be left permanently in a MEMS device with other film structures and materials for certain thermal, optical and electrical functions of its nature.

Advantageously, the present embodiment uses a stack of carbon films as sacrificial layers for fabricating MEMS device. Comparing with the conventional technology which uses photoresist as sacrificial layers, the sacrificial layers of carbon films can provide mechanically and physically robust supporting base for depositing and lithographically patterning a suspended structural element. Besides, by using the sacrificial layers of carbon films, the MEMS device may be fabricated at a relatively low temperature to avoid high temperature steps, which enables temperature sensitive materials that could be damaged by high temperature steps existing MEMS processes to be employed to form MEMS devices. In addition, the present embodiment can be compatible to IC processing because the low temperature etching process does not impact the previously formed IC devices so that the MEMS structures proximate IC device can be formed.

Figure 3:
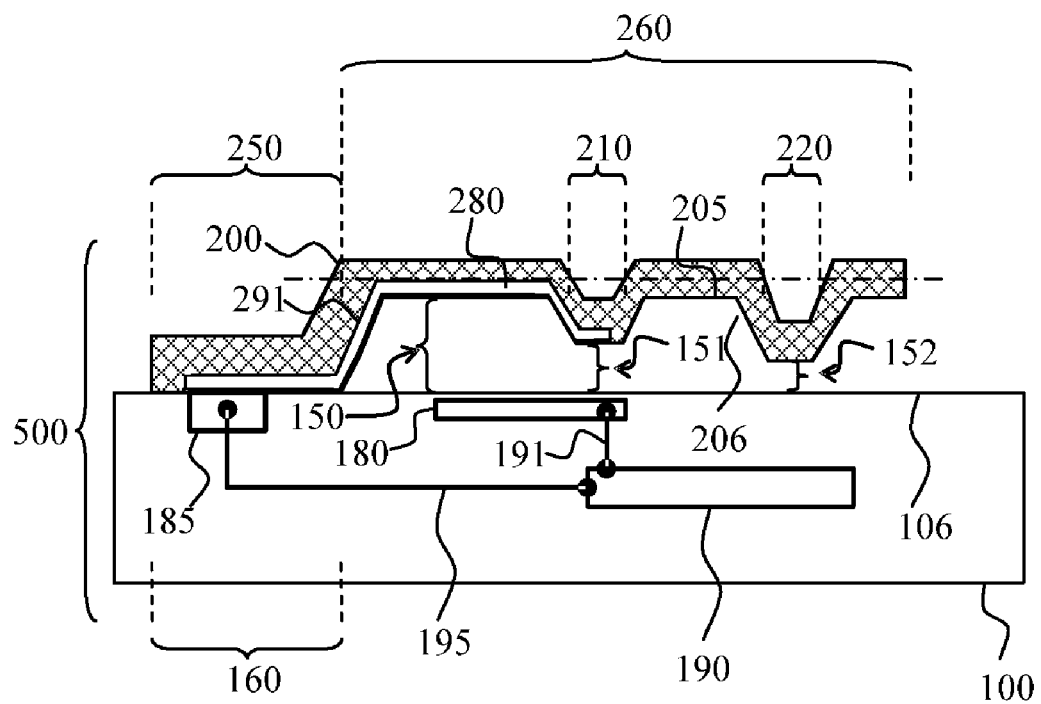
FIG. 3 is a cross-sectional view of the MEMS device in another embodiment of the present invention.

FIG. 3 is a cross-sectional view of the MEMS device in another embodiment of the present invention, containing micro components for generating electrostatic interaction between the suspended thin film microstructure 200 and the substrate 100. Herein, the substrate 100 includes a bottom electrode 180, an electrical pad 185 and a drive circuitry 190 readily produced in semiconductor fabrication process prior to the process of the first carbon film 110 described previously. The bottom electrode 180 and the electrical pad 185 are electrically connected to the drive circuitry 190 through a bottom electrode interconnect 191 and an electrical pad interconnect 195, respectively. Meanwhile, the suspended thin film microstructure 200 includes a top electrode 280 and a top electrode interconnect 291 also electrically connected. Furthermore, the top electrode interconnect 291 on the suspended thin film microstructure 200 is electrically connected to the electrical pad 185 so as to electrically connect the top electrode 280 to the drive circuitry 190 on the substrate 100; therefore, compulsive or contractive electrostatic force is generated by charging the top electrode 280 and the bottom electrode 180 in the same or opposite polarization (voltages) through the drive circuitry 190, so as to allow the suspended portion 260 to move relatively to the substrate 100.

A process has been described as useful for fabricating an MEMS device using carbon films as both the sacrificial material and topographical patterning materials. While specific applications and examples of the invention have been illustrated and discussed, the principles disclosed herein provide a basis for practicing the invention in a variety of ways and in a variety of IC and MEMS structures. Numerous variations are possible within the scope of the invention. For example, the first carbon film 110, the second carbon film 120 and the third carbon film 130 may be formed by the same material, and alternatively, they may also be formed by different materials.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the scope of the present invention and covered in the claims of the present invention.

What is claimed is:

1. A method for fabricating the MEMS device, comprising:
    depositing a first carbon film onto a substrate;
    lithographically patterning the first carbon film to remove a first sacrificial pre-removal portion to expose the substrate, the first sacrificial pre-removal portion corresponding to a first recess portion of a suspended thin film microstructure;
    depositing a second carbon film conformally onto the first carbon film, wherein a portion of the second carbon film corresponding to the first recess portion is in direct contact with the substrate at a location corresponding to the first sacrificial pre-removal portion;
    lithographically patterning the second carbon film to form an opening so as to expose an anchoring portion of the substrate;
    depositing and lithographically patterning the suspended thin film microstructure onto a stack of the first carbon film and the second carbon film; and
    removing the first carbon film and the second carbon film.

2. The method according to claim 1, wherein, before the step of lithographically patterning the second carbon film to form an opening so as to expose an anchoring portion of the substrate, the method further comprises:
    lithographically patterning the second carbon film to remove a second sacrificial pre-removal portion to expose the substrate, the second sacrificial pre-removal portion corresponding to a second recess portion of the suspended thin film microstructure;
    depositing a third carbon film conformally onto the second carbon film, wherein a portion of the third carbon film corresponding to the second recess portion is in direct contact with the substrate at a location corresponding to the second sacrificial pre-removal portion;
    the step of depositing and lithographically patterning the suspended thin film microstructure onto a stack of the first carbon film and the second carbon film comprises:
    depositing and lithographically patterning the suspended thin film microstructure onto a stack of the first carbon film, the second carbon film and the third carbon film;
    the step of removing the first carbon film and the second carbon film comprises:
    removing the first carbon film, the second carbon film, and the third carbon film to form a suspended thin film microstructure with the first recess portion and the second recess portion, wherein a first vertical clearance between a bottom surface of the first recess portion and a top surface of the substrate is smaller than a second vertical clearance between a bottom surface of the second recess portion and the top surface of the substrate.

3. The method according to claim 2, wherein any of the first carbon film, the second carbon film and the third carbon film is removed by selective etch process gas of oxygen or nitrogen in a reactor chamber containing plasma generated with a plasma source power.

4. The method according to claim 2, wherein the first carbon film, the second carbon film or the third carbon film is deposited by means of:
   placing the substrate in a reactor chamber;
   introducing a carbon-containing process gas into the reactor chamber and introducing a layer-enhancing additive gas that enhances thermal properties of the first carbon film, the second carbon film or the third carbon film;
   generating a reentrant toroidal RF plasma current in a reentrant path that includes a process zone overlying the substrate by coupling a plasma RF source power to an external portion of the reentrant path; and
   coupling RF plasma bias power or bias voltage to the substrate.

5. The method according to claim 4, wherein the first carbon film, the second carbon film or the third carbon film comprises less than 9 percent of hydrogen.

* * * * *